United States Patent [19]

Holmstrom et al.

[11] Patent Number: 4,627,883

[45] Date of Patent: Dec. 9, 1986

[54] METHOD OF FORMING AN ISOLATED SEMICONDUCTOR STRUCTURE

[75] Inventors: Roger P. Holmstrom, Wayland; Jim-Yong Chi, Bedford, both of Mass.

[73] Assignee: GTE Laboratories Incorporated, Waltham, Mass.

[21] Appl. No.: 718,254

[22] Filed: Apr. 1, 1985

[51] Int. Cl.[4] .................. H01L 21/38; H01L 21/465
[52] U.S. Cl. ............................. 148/187; 29/576 W; 29/580; 148/186; 204/34.5
[58] Field of Search .............. 148/187, 186; 204/34.5; 29/576 W, 580

[56] References Cited

U.S. PATENT DOCUMENTS

| | | | |
|---|---|---|---|
| 3,919,060 | 11/1975 | Pogge et al. | 204/129.3 |
| 4,016,017 | 4/1977 | Aboaf et al. | 148/187 |
| 4,104,090 | 8/1978 | Pogge | 148/175 |
| 4,369,561 | 1/1983 | Tonnel | 148/187 X |
| 4,380,865 | 4/1983 | Frye et al. | 29/576 W |
| 4,437,226 | 3/1984 | Soclof | 29/576 W |
| 4,510,016 | 4/1985 | Chi et al. | 29/576 W |
| 4,532,700 | 8/1985 | Kinney et al. | 29/576 W |
| 4,569,701 | 2/1986 | Oh | 29/576 W |

Primary Examiner—George T. Ozaki
Attorney, Agent, or Firm—David M. Keay

[57] ABSTRACT

Method of producing a silicon structure for fabricating integrated circuit devices therein by forming a plurality of regions of N-type single crystal silicon of high resistivity inset in the surface of silicon of either P-type conductivity or of N-type conductivity of low resistivity. The silicon contiguous with the regions of high resistivity N-type silicon is converted to porous silicon by anodically treating in an aqueous solution of HF. Then, conductivity type imparting material is diffused through the porous silicon into portions of the regions of N-type conductivity to alter their electrical characteristics to P-type or to low resistivity N-type. The porous silicon is then oxidized to silicon oxide, electrically isolating each of the N-type regions and its associated portion.

14 Claims, 8 Drawing Figures

METHOD OF FORMING AN ISOLATED SEMICONDUCTOR STRUCTURE

BACKGROUND OF THE INVENTION

This invention relates to semiconductor integrated circuit structures. More particularly, it is concerned with monolithic integrated circuit structures for the fabrication of semiconductor integrated circuit devices therein and to methods of producing such structures.

In the manufacture of monolithic semiconductor integrated circuits it is necessary that the structure in which the integrated circuit devices are fabricated provide for electrical isolation between the devices as may be required to prevent undesired interactions between them. Typically semiconductor integrated circuit structures contain a plurality of regions which are electrically insulated from each other or may be electrically isolated from each other by the application of appropriate biasing potentials. For certain types of device structures it is desirable to include so-called buried layers of relatively high conductivity in underlying portions of the regions in order to provide enhanced device and circuit performance. Conventional processes of fabricating monolithic semiconductor integrated circuit structures having electrically isolated regions with buried layers are complex and expensive.

SUMMARY OF THE INVENTION

An improved method for producing a semiconductor integrated circuit structure in accordance with the present invention comprises providing a body of single crystal silicon having a layer of P-type conductivity or of N-type conductivity of low resistivity. A plurality of regions of N-type conductivity of high resistivity are inset in the layer at a surface thereof. Each of the regions is surrounded by silicon of the layer except at the surface and has an interface with the silicon of the layer. The silicon of the layer contiguous with the interfaces with the regions is converted to porous silicon. Conductivity type imparting material is diffused through the porous silicon into portions of the regions contiguous with the interfaces to alter the electrical characteristics thereof. Then, portions of the porous silicon contiguous with the interfaces are oxidized to form insulating material electrically isolating each of the regions.

A semiconductor integrated circuit structure in accordance with the present invention comprises a body of silicon having an underlying substrate of single crystal silicon. A layer of oxidized porous silicon is contiguous with the substrate. A plurality of regions of single crystal silicon are inset in the layer at a surface thereof. Each region is surrounded by the layer of oxidized porous silicon except at the surface. Each of the regions includes a section of N-type conductivity of high resistivity and a portion having different electrical characteristics. The section has a surface area in the surface, and the portion is contiguous with the section and with the layer of oxidized porous silicon and lies interposed between them.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following disclosure and appended claims in connection with the above-described drawings.

DETAILED DESCRIPTION OF THE INVENTION

In fabricating a monolithic integrated circuit structure containing a large number of individual circuit networks a wafer or slice of single crystal semiconductor material, specifically silicon, is provided as a supporting structure. As is well understood the slice or wafer is usually of relatively large surface area upon which many identical circuit networks each including many devices are fabricated simultaneously. However, for purposes of illustrating the fabrication of a structure in accordance with the present invention, a fragment of a slice is shown in the figures and described.

Figure 1A:
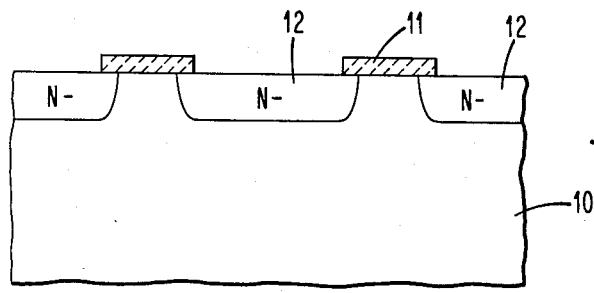
FIGS. 1A through 1C are a series of elevational views in cross-section illustrating various stages in the fabrication of an integrated circuit structure in accordance with the present invention.

A slice or wafer of single crystal silicon having flat, planar, parallel opposed major surfaces, a fragment 10 of which is illustrated in FIG. 1A, is produced by any of the known techniques of crystal fabrication including appropriate slicing and cleaning operations. In accordance with the method of the present invention the slice may be of heavily doped N-type or P-type conductivity, that is of low resistivity, or may be of P-type conductivity of relatively high or moderate resistivity. The surface of the slice 10 is coated with an adherent protective coating 11 as of silicon oxide in which openings are formed in a desired pattern by known photolithographic masking and etching techniques. N-type conductivity imparting material is introduced at the surface of the slice at the openings in the silicon oxide protective coating by diffusion or by ion implantation. A plurality of individual N-type regions 12 of moderate resistivity are thus formed. Each of the regions 12 is separated from the other regions by intervening silicon of the original slice with original electrical characteristics as defined by the openings in the silicon oxide coating 11. In accordance with the present invention it is necessary for the N-type regions 12 to be of moderate to high resistivity N-type conductivity and thus to differ from the remainder of the slice.

Figure 1B:
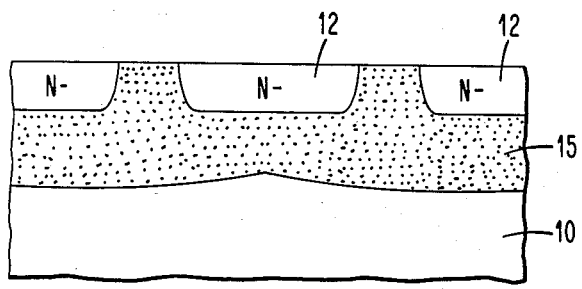

The slice is then anodically treated in an aqueous solution of hydrofluoric acid in order to convert silicon contiguous with the N-type regions 12 to porous silicon 15 as illustrated in FIG. 1B. The technique for forming porous silicon by this treatment is described in U.S. Pat. No. 3,640,806 to Watanabe et al. As is known this treatment causes silicon which is P-type or is highly conductive N-type to be etched to become porous material. Current density during treatment may be from 5 to 100 $mA/cm^2$ and the etching solution is from 15 to 48 weight % HF in water. Thus portions 15 of the original slice 10 are selectively converted to porous silicon of about 40 to 50% of its original density. The high resistivity N-type regions 12 inset in the slice are not significantly affected and remain essentially in their original condition.

Figure 1C:
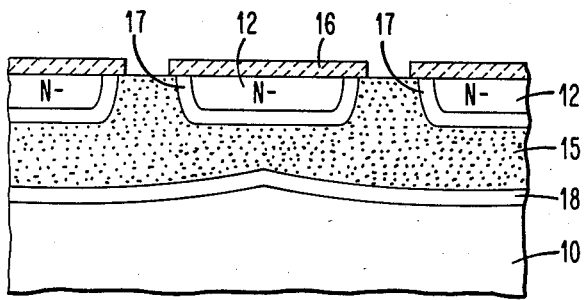

As is illustrated in FIG. 1C the surface of the slice is then covered with a protective coating 16 as of silicon oxide. Openings are made by known photolithographic masking and etching techniques to protect the N-type regions 12 while exposing intervening surface areas of the porous silicon 15. The slice is then exposed to an atmosphere containing conductivity type imparting material. The conductivity type imparting material may be either N-type or P-type as desired. The gaseous conductivity type imparting material readily passes through the pores of the porous silicon 15 and diffuses into the N-type regions 12 at the interfaces contiguous with the porous silicon 15. The conductivity regions to form either heavily doped low resistivity N-type buried layers or to form heavily doped P-type zones which provide rectifying junctions with the remainder of the associated N-type regions. At the same time the conductivity type imparting material diffuses into the portions 18 of the single crystal silicon 10 contiguous with the porous silicon 15.

Next, the slice is treated in an oxidizing atmosphere at a high temperature to oxidize the porous silicon 15 and convert it to silicon oxide. In addition the diffused conductivity type imparting material is driven further into the N-type regions 12 to the desired depth in the portions 17 of altered electrical characteristics. The resulting structure as illustrated in FIG. 1C includes regions 12 having sections of N-type conductivity of high resistivity contiguous with outer portions 17 of low resistivity N-type or P-type silicon. The regions 12 are isolated from each other by the nonconductive porous silicon oxide which surrounds each region except at its surface.

Figure 2A:
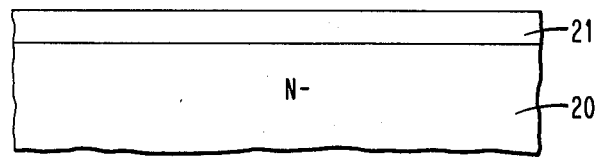
FIGS. 2A through 2E are a series of elevational views in cross-section illustrating various stages in a modification of the method of fabricating an integrated circuit structure in accordance with the present invention.

FIGS. 2A through 2E illustrate a modification of the method in accordance with the present invention in which more precise control of the oxidized porous silicon portion is obtained. As illustrated in FIG. 2A a slice 20 is fabricated which is lightly doped with N-type conductivity imparting material to provide a high resistivity substrate. A conductivity type imparting material which may be either N or P-type as desired is introduced as by diffusion at the flat planar upper surface of the slice to produce a layer 21 of low resistivity.

Figure 2B:
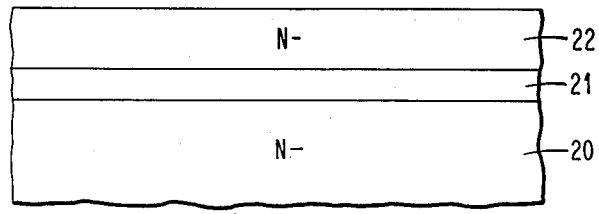

A layer 22 of N-type silicon of high resistivity is grown on the surface of the layer 21 as illustrated in FIG. 2B as by known epitaxial deposition techniques. The epitaxial layer 22 is precisely controlled as to thickness and as to resistivity and is a continuation of the crystalline structure of the single crystal slice 20. The upper surface of the epitaxial layer 22 is parallel to the interface between the silicon of the original slice and the epitaxial layer.

Figure 2C:
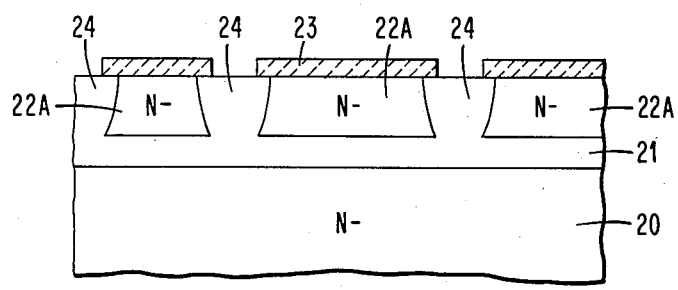
Figure 2D:
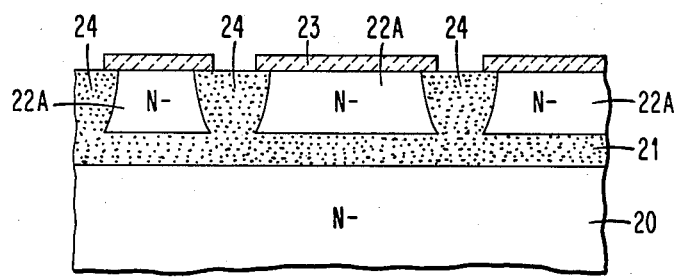

Next, as illustrated in FIG. 2C an adherent coating 23 of a suitable protective material, specifically silicon nitride, is placed on the surface of the epitaxial layer 22. Openings are made in the silicon nitride coating 23 to expose areas of the surface in a desired pattern encircling regions 22A of high resistivity N-type silicon. Conductivity type imparting material is diffused through the openings in the coating 23 into the underlying zones 24 to the depth of the interface with the underlying layer 21. Desirably the conductivity type of the zones 24 and of the underlying layer 21 are the same, producing a region of high conductivity surrounding each of a plurality of high resistivity N-type regions 22A except at the surface.

The slice is anodically treated in an aqueous hydrofluoric acid solution in the manner as explained previously. The highly conductive layer 21 and zones 24 are converted to porous silicon by this treatment while the N-type regions 22A and the underlying substrate 20 which are of high resistivity N-type silicon are not significantly affected.

Figure 2E:
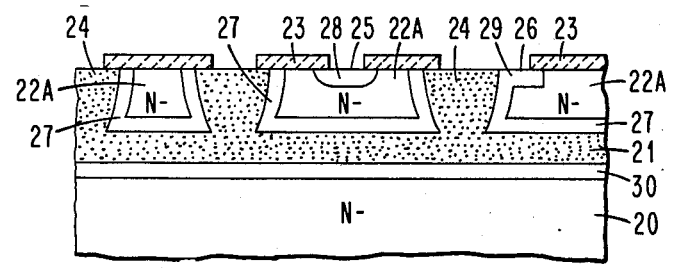

Portions of the silicon nitride coating 23 may then be removed to expose surface areas of desired configuration, such as areas 25 and 26 of certain of the N-type regions 22A as illustrated in FIG. 2E. The slice is subjected to a gaseous atmosphere containing conductivity type imparting material. The conductivity type imparting material, either N-type or P-type as desired, passes through the porous region of the layer 21 and zones 24 to be diffused into the N-type regions 22A and also into the substrate 20. Thus, the electrical characteristics of portions 27 of the regions 22A are altered either to heavily doped N-type or to P-type forming P-N junctions with the unaltered N-type sections of the regions 22A. Portions 28 and 29 are also formed at the exposed surface areas 25 and 26, respectively, of certain regions 22A. Portion 28 is separated from the portion 27 by intervening N-type material of the region 22A. Portion 29 completes a continuous low resistivity path from the surface area 26 to the underlying portion 27. The diffused conductivity type imparting material also produces a layer 30 of different electrical characteristics by diffusing into the N-type substrate 20.

The slice is then treated by heating at an elevated temperature in an oxidizing atmosphere to oxidize the porous silicon of layer 21 and zones 24 to form silicon oxide. In addition, the diffused conductivity type imparting material is driven to a desired depth farther into the portions 27, 28, and 29. Thus electrically isolated regions 22A having sections of N-type material of high resistivity and outer portions of appropriate conductivity type of relatively low resistivity are formed in the slice. The configuration of the electrically isolated N-type sections and the pattern of diffused low resistivity material may be varied in practicing the invention in accordance with the foregoing techniques. As is well understood the various components of integrated circuit networks may be fabricated in the N-type regions of the resulting structure.

While there has been shown and described what are considered preferred embodiments of the present invention, it will be obvious to those skilled in the art that various changes and modifications may be made therein without departing from the invention as defined by the appended claims.

What is claimed is:

1. The method of producing a semiconductor integrated circuit structure comprising
   providing a body of single crystal silicon having a layer of P-type conductivity or of N-type conductivity of low resistivity with a plurality of regions of N-type conductivity of high resistivity inset in said layer at a surface thereof, each of said regions being surrounded by silicon of said layer except at said surface and having an interface with the silicon of said layer;
   converting silicon of said layer contiguous with the interfaces with said regions to porous silicon;
   diffusing conductivity type imparting material through the porous silicon into portions of said regions contiguous with said interfaces to alter the electrical characteristics thereof; and oxidizing portions of the porous silicon contiguous with said interfaces to form insulating material electrically isolating each of said regions.

2. The method in accordance with claim 1 wherein providing a body of single crystal silicon having a layer of P-type conductivity or of N-type conductivity of low resistivity with a plurality of regions of N-type conductivity of high resistivity inset therein at a surface thereof includes providing a body of single crystal silicon having a layer of P-type conductivity of high resistivity at a surface thereof; and introducing N-type conductivity imparting material into a plurality of regions at said surface to convert the regions to N-type conductivity of high resistivity.

3. The method in accordance with claim 2 wherein diffusing conductivity type imparting material through the porous silicon includes diffusing N-type conductivity imparting material into said portions of said regions to convert the portions to N-type conductivity of low resistivity.

4. The method in accordance with claim 2 wherein diffusing conductivity type imparting material through the porous silicon includes diffusing P-type conductivity imparting material into said portions of said regions to convert the portions to P-type conductivity.

5. The method in accordance with claim 2 wherein oxidizing portions of the porous silicon comprises heating the body in an oxidizing atmosphere to convert the portions of porous silicon to silicon oxide and to further diffuse the conductivity type imparting material into said portions of said regions.

6. The method in accordance with claim 5 wherein converting silicon to porous silicon includes anodically treating the body in an aqueous etching solution.

7. The method of producing a semiconductor integrated circuit structure comprising providing a substrate of single crystal silicon having a layer of N-type conductivity of high resistivity;

forming a layer of single crystal silicon of P-type conductivity or of N-type conductivity of low resistivity having an interface with said N-type layer;

growing an epitaxial layer of silicon of N-type conductivity of high resistivity having an interface with said layer and having a surface spaced from said interface;

introducing conductivity type imparting material into zones of said epitaxial layer extending from said surface thereof to said interface with said layer to form a plurality of regions of N-type conductivity of high resistivity, each region being encircled by said zones and having an interface therewith;

converting the silicon of said layer and of said zones to porous silicon;

diffusing conductivity type imparting material through the porous silicon of said layer and said zones into portions of said regions contiguous with said interfaces to alter the electrical characteristics thereof; and oxidizing said porous silicon to form insulating material electrically isolating each of said regions.

8. The method in accordance with claim 7 wherein said layer of single crystal silicon is of P-type conductivity.

9. The method in accordance with claim 7 wherein forming a layer of single crystal silicon comprises introducing P-type conductivity imparting material into said substrate.

10. The method in accordance with claim 9 wherein introducing conductivity type imparting material into zones of said epitaxial layer comprises introducing P-type conductivity imparting material to convert said zones to P-type conductivity.

11. The method in accordance with claim 10 wherein diffusing conductivity type imparting material through the porous silicon includes diffusing N-type conductivity imparting material into said portions of said regions to convert the portions to N-type conductivity of low resistivity.

12. The method in accordance with claim 10 wherein diffusing conductivity type imparting material through the porous silicon includes diffusing P-type conductivity imparting material into said portions of said regions to convert the portions to P-type conductivity.

13. The method in accordance with claim 10 wherein oxidizing said porous silicon comprises heating in an oxidizing atmosphere to convert the porous silicon to silicon oxide and to further diffuse the conductivity type imparting material into said portions of said regions.

14. The method in accordance with claim 13 wherein converting the silicon of said layer and of said zones to porous silicon includes anodically treating in an aqueous etching solution.

* * * * *